United States Patent

Kim et al.

(10) Patent No.: US 9,722,008 B2
(45) Date of Patent: Aug. 1, 2017

(54) ORGANIC LIGHT-EMITTING DISPLAY APPARATUS INCLUDING A REFLECTION CONTROL LAYER AS A CAPACITOR ELECTRODE

(71) Applicant: Samsung Display Co., Ltd., Yongin (KR)

(72) Inventors: Hyeonsik Kim, Yongin (KR); Chungsock Choi, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/607,806

(22) Filed: Jan. 28, 2015

(65) Prior Publication Data

US 2016/0056221 A1    Feb. 25, 2016

(30) Foreign Application Priority Data

Aug. 22, 2014    (KR) .......................... 10-2014-0109970

(51) Int. Cl.

| H01L 27/00 | (2006.01) |
| H01L 51/00 | (2006.01) |
| H01L 27/32 | (2006.01) |
| H01L 51/52 | (2006.01) |

(52) U.S. Cl.
CPC ...... H01L 27/3265 (2013.01); H01L 51/5271 (2013.01); H01L 51/5281 (2013.01)

(58) Field of Classification Search
CPC ............. H01L 27/3244; H01L 51/5281; H01L 51/5284; H01L 27/1218; H01L 27/3258; H01L 51/5221; H01L 51/5268; H01L 51/5275; H01L 51/56; H05B 33/10; H05B 33/22

See application file for complete search history.

(56) References Cited

U.S. PATENT DOCUMENTS

| 7,495,385 | B2 | 2/2009 | Lee et al. | |
| 2003/0206265 | A1* | 11/2003 | Yasukawa | G02F 1/136209 349/187 |

(Continued)

FOREIGN PATENT DOCUMENTS

| KR | 10-2011-0049476 | 5/2011 |
| KR | 10-2013-0106754 | 9/2013 |
| KR | 10-2014-0019990 | 2/2014 |

*Primary Examiner* — John C Ingham
*Assistant Examiner* — Ismail Muse
(74) *Attorney, Agent, or Firm* — H.C. Park & Associates, PLC

(57) ABSTRACT

An organic light-emitting display apparatus, including a substrate, a reflection control layer disposed on the substrate and including a metal layer and dielectric layer, a thin-film transistor disposed on the reflection control layer and including an active layer, a gate electrode, a source electrode, and a drain electrode, a storage capacitor disposed on the reflection control layer and including a first electrode and a second electrode, a pixel electrode connected to one of the source electrode and the drain electrode, an intermediate layer disposed on the pixel electrode and including an organic emission layer, an opposite electrode disposed on the intermediate layer, in which a portion of the metal layer of the reflection control layer comprises the first electrode of the storage capacitor.

13 Claims, 3 Drawing Sheets

(56) References Cited

U.S. PATENT DOCUMENTS

| | | | |
|---|---|---|---|
| 2004/0004221 A1* | 1/2004 | Murade | H01L 29/78609 257/72 |
| 2004/0124432 A1 | 7/2004 | Ko | |
| 2005/0285197 A1* | 12/2005 | Park | H01L 29/4908 257/347 |
| 2008/0068525 A1* | 3/2008 | Ishii | G02F 1/136209 349/44 |
| 2008/0237585 A1* | 10/2008 | Kim | H01L 27/3265 257/40 |
| 2012/0097930 A1* | 4/2012 | Park | H01L 51/5284 257/40 |
| 2012/0280612 A1 | 11/2012 | Lee et al. | |
| 2013/0126871 A1* | 5/2013 | Wei | H01L 27/1255 257/59 |
| 2013/0249383 A1* | 9/2013 | Yoo | H05B 33/22 313/504 |
| 2013/0257268 A1 | 10/2013 | Li et al. | |
| 2014/0042396 A1* | 2/2014 | Yang | H01L 51/5221 257/40 |

* cited by examiner

ORGANIC LIGHT-EMITTING DISPLAY APPARATUS INCLUDING A REFLECTION CONTROL LAYER AS A CAPACITOR ELECTRODE

CROSS-REFERENCE TO RELATED APPLICATION

This application claims priority from and the benefit of Korean Patent Application No. 10-2014-0109970, filed on Aug. 22, 2014, which is hereby incorporated by reference for all purposes as if fully set forth herein.

BACKGROUND

Field

Exemplary embodiments of the present invention relate to an organic light-emitting display apparatus.

Discussion of the Background

Display apparatuses display an image, and an organic light-emitting display apparatus has been used as a display apparatus.

An organic light-emitting display apparatus is a self-emissive display apparatus that does not require a separate light source. Accordingly, the organic light-emitting display apparatus may be thinner and lighter-weight than a liquid crystal display device. Also, the organic light-emitting display apparatus may have high-quality characteristics, such as low power consumption, high brightness, and a fast response time.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments of the present invention provide a bottom emission type organic light-emitting display apparatus.

Additional aspects will be set forth in the detailed description which follows, and, in part, will be apparent from the disclosure, or may be learned by practice of the inventive concept.

According to an exemplary embodiments of the present invention, an organic light-emitting display apparatus includes a substrate, a reflection control layer disposed on the substrate and including a metal layer and a dielectric layer, a thin-film transistor (TFT) formed on the reflection control layer and including an active layer, a gate electrode, a source electrode, and a drain electrode, a storage capacitor disposed on the reflection control layer and including a first electrode and a second electrode, a pixel electrode connected to one of the source electrode and the drain electrode, an intermediate layer disposed on the pixel electrode and including an organic emission layer, an opposite electrode disposed on the intermediate layer, in which a portion of the metal layer of the reflection control layer comprises the first electrode of the storage capacitor.

The metal layer may include a first area comprising the first electrode of the storage capacitor, and a second area separated from and surrounding the first area.

The second area may include a lattice structure.

The second area may include holes.

The storage capacitor may further include a third electrode disposed in parallel with respect to the first electrode, and the second electrode is disposed between the first electrode and the third electrode.

The second electrode and the active layer may be disposed on the same layer and comprise the same material. The third electrode and at least one of the gate electrode, the source electrode, and the drain electrode may be disposed on the same layer and comprise the same material.

The second electrode and the gate electrode may be disposed on the same layer and comprise the same material. The third electrode, the source electrode, and the drain electrode may be disposed on the same layer and comprise the same material.

The third electrode may be electrically connected to the first electrode via a contact hole that penetrates through insulating layers that are disposed between the first electrode and the third electrode.

The intermediate layer may be configured to generate light that passes through the reflection control layer and is emitted outside of the organic light-emitting display apparatus.

A buffer layer may be disposed between the first electrode and the second electrode of the storage capacitor.

The substrate may be a flexible substrate.

The first, second, and third electrodes may overlap and be in parallel with each other, and the capacitance of the storage capacitor corresponds to the sum of a first capacitance between the first and second electrodes and a second capacitance between the second and third electrodes.

According to an exemplary embodiments of the present invention, a method of manufacturing an organic light-emitting display apparatus may include, depositing a dielectric layer and a metal layer on a substrate to form a reflection control layer, patterning the metal layer to form a first area and a second area simultaneously, the second area being separated from and surrounding the first area, disposing a thin-film transistor (TFT) on the reflection control layer, the TFT comprising an active layer, a source electrode, and a drain electrode, disposing a storage capacitor on the reflection control layer, the storage capacitor comprising a first, second, and third electrodes, forming a contact hole configured to electrically connect the first area of the metal layer and the third electrode of the storage capacitor, the first area comprising the first electrode of the storage capacitor, depositing a pixel electrode, the pixel electrode being connected to one of the source electrode and the drain electrode, and depositing an organic emission layer on the pixel electrode.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
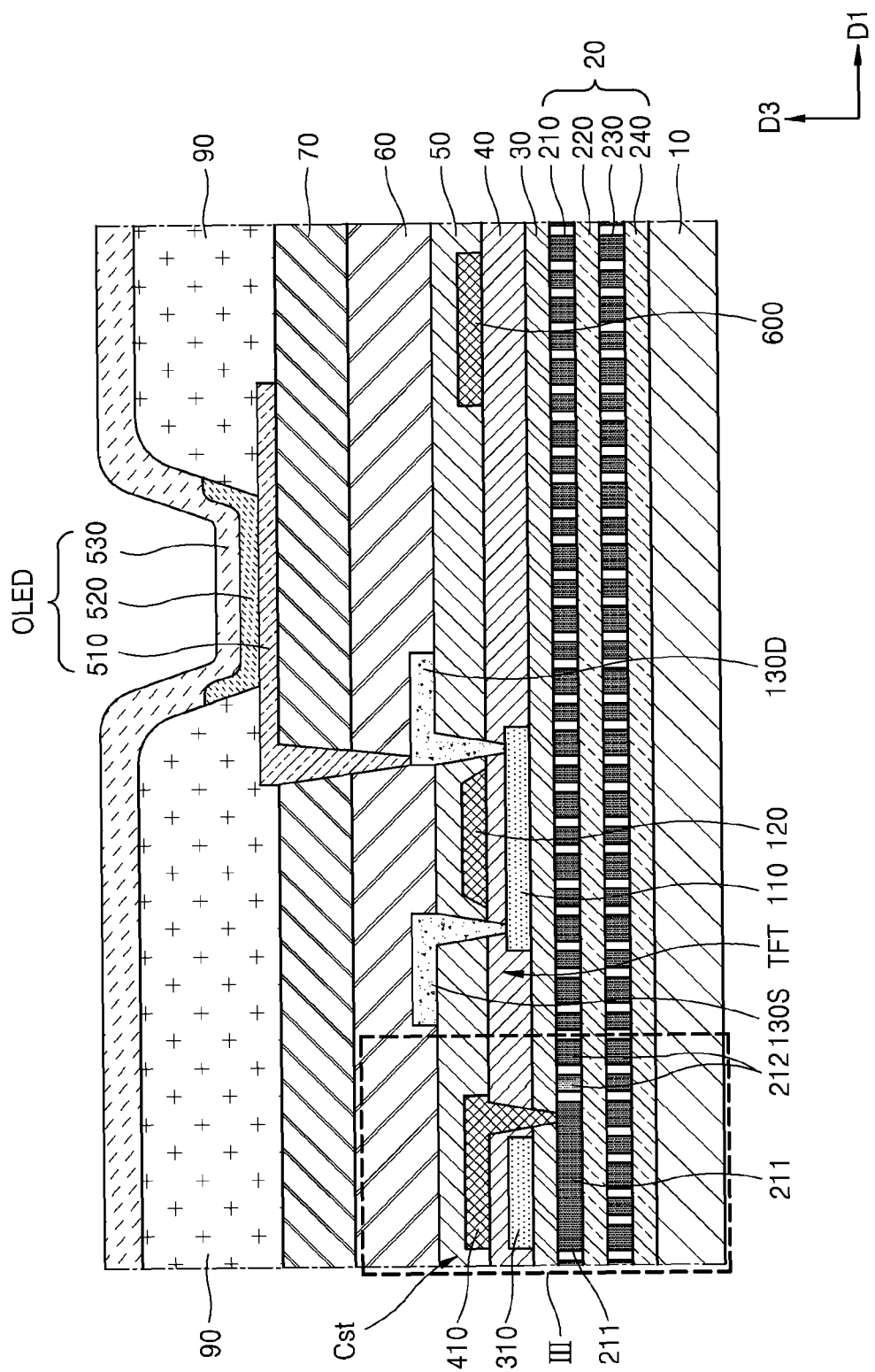
FIG. 1 is a cross-sectional view of an organic light-emitting display apparatus according to an exemplary embodiment of the present invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
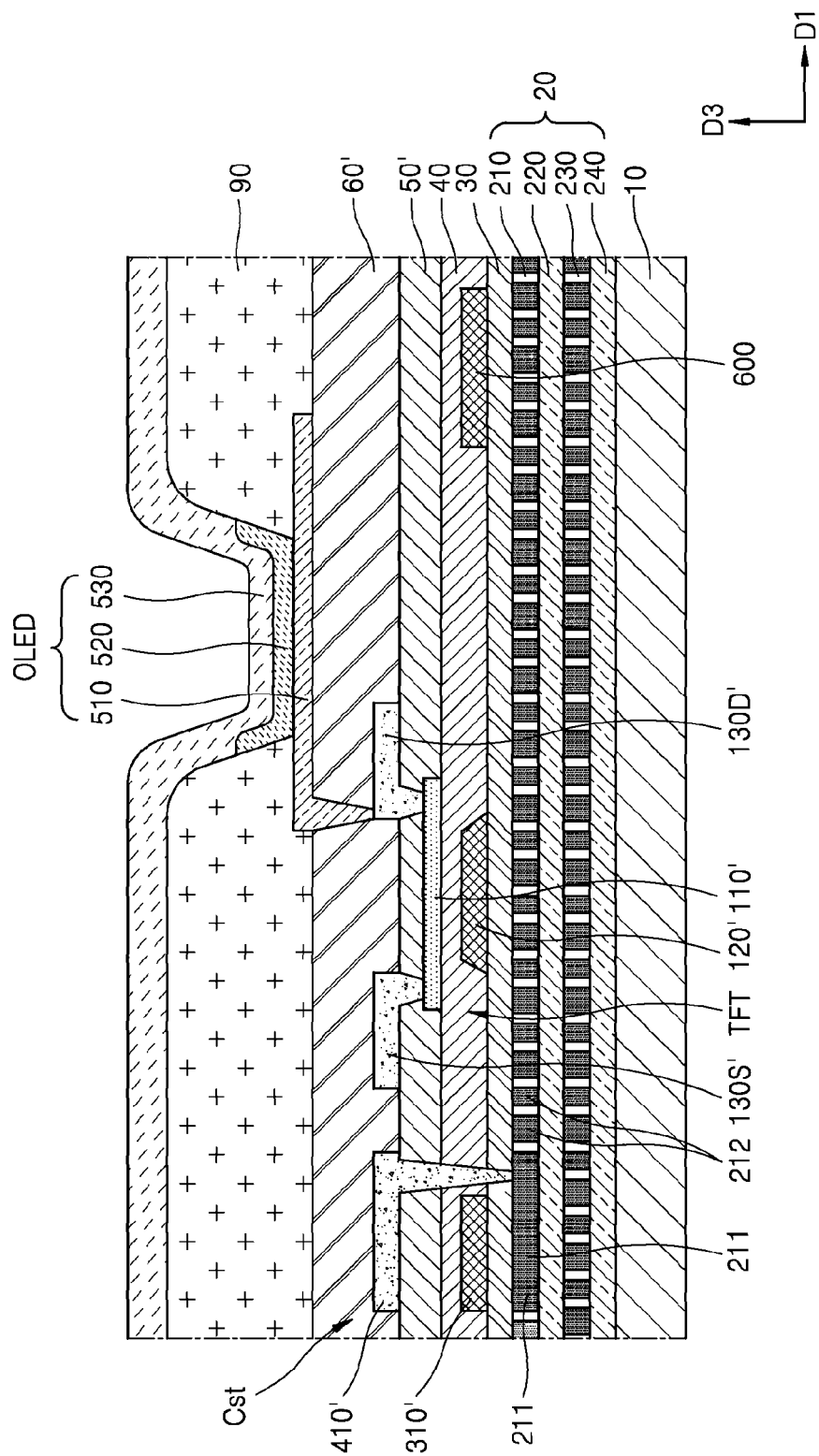
FIG. 2 is a cross-sectional view of an organic light-emitting display apparatus according to an exemplary embodiment of the present invention.
Figure 3:
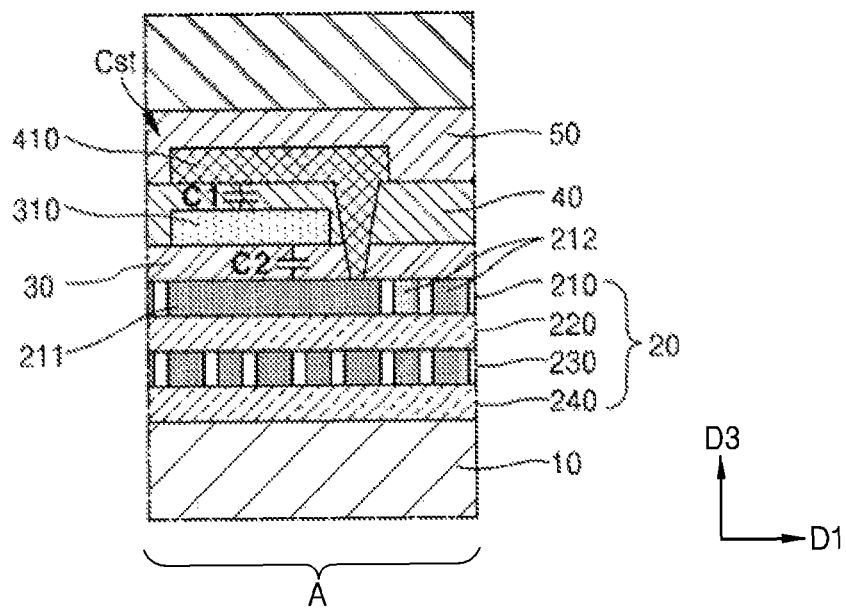
FIG. 3 is a magnified view of portion III of FIG. 1.

FIG. 1 is a cross-sectional view of an organic light-emitting display apparatus according to an exemplary embodiment of the present invention. FIG. 2 is a cross-sectional view of an organic light-emitting display apparatus according to an exemplary embodiment of the present invention. FIG. 3 is a magnified view of a portion III of FIG. 1.

Referring to FIGS. 1 and 2, each of the organic light-emitting display apparatuses includes a substrate 10, a reflection control layer 20, a thin-film transistor TFT, a storage capacitor Cst, a wiring 600, and an organic light-emitting device OLED that are formed on the substrate 10.

The substrate 10 may be a light-transmitting substrate formed of a glass or plastic material. The plastic material may include polyethylene terephthalate (PET), polyethylene naphthalate (PEN), or polyimide. When the substrate 10 is formed of the plastic material, the substrate 10 may have flexibility.

The reflection control layer 20 includes a metal layer and a dielectric layer and thus reflects light that is incident from an external source. The reflection control layer 20 may have an alternating stacked structure of the metal layer and the dielectric layer. Referring to FIGS. 1 and 2, the reflection control layer 20 may have an alternating stacked structure of a first metal layer 210, a first dielectric layer 220, a second metal layer 230, and a second dielectric layer 240.

Each of the first metal layer 210 and the second metal layer 230 of the reflection control layer 20 may reflect light incident from the external source with a phase difference of 180 degrees, so that the light becomes extinct. A phase of light may be controlled by adjusting a thickness of the first dielectric layer 220 and the second dielectric layer 240 of the reflection control layer 20.

In the present exemplary embodiment, the organic light-emitting display apparatus is a bottom emission type in which light emitted from the organic light-emitting device OLED passes through the reflection control layer 20 and the substrate 10, and then discharged externally.

The reflection control layer 20 may be formed of a thin metal layer and a thin dielectric layer, and thus have light-transmittance. For example, the first and second metal layers 210 and 230 may be formed of metal, such as aluminum (Al), titanium (Ti), or silver (Ag) with a thickness less than or equal to about 100 nm, and the first and second dielectric layers 220 and 240 may be formed of an inorganic material such as SiOx. In an exemplary embodiment of the present invention, the thickness of the reflection control layer 20 may be less than to equal to about 1 μm to provide light-transmittance. The reflection control layer 20 having such small thickness may be used in a rigid organic light-emitting display apparatus as well as a flexible organic light-emitting display apparatus.

A portion of the metal layer may be formed as a first electrode 211 of the storage capacitor Cst. According to the present exemplary embodiment, the first metal layer 210 that is the uppermost layer of the reflection control layer 20 includes a first area 211 that has a predetermined size, and a second area 212 separated from the first area 211. The first area 211 may be formed as the first electrode 211 of the storage capacitor Cst. The second area 212 may be patterned so as to prevent the second area 212 and the wiring 600 from generating a parasitic capacitance. A structure of the first metal layer 210 will be described in detail with reference to FIGS. 4A and 4B.

A buffer layer 30 may be formed on the reflection control layer 20. The buffer layer 30 forms a planar surface on the substrate 10 and prevents penetration of foreign substances.

Referring to FIG. 1, the thin-film transistor TFT may be a top gate type and include an active layer 110, a gate electrode 120, a source electrode 130S, and a drain electrode 130D. A first insulating layer 40 as a gate insulating layer may be interposed between the gate electrode 120 and the active layer 110 to insulate the gate electrode 120 from the active layer 110. A second insulating layer 50 as an interlayer insulating layer may be interposed between the gate electrode 120 and the source and drain electrodes 130S and 130D. A third insulating layer 60 and a fourth insulating layer 70 may be formed on the source electrode 130S and the drain electrode 130D, and a pixel-defining layer 90 and the organic light-emitting device OLED may be disposed on the fourth insulating layer 70. According to the present exemplary embodiment, the third and fourth insulating layers 60 and 70 are formed on the thin-film transistor TFT. In an exemplary embodiment of the present invention, one of the third and fourth insulating layers 60 and 70 may be formed below the pixel-defining layer 90 and the organic light-emitting device OLED.

Referring to FIG. 2, the thin-film transistor TFT may be a bottom gate type and include a gate electrode 120', an active layer 110', a source electrode 130S', and a drain electrode 130D'. The first insulating layer 40 as a gate insulating layer may be disposed between the gate electrode 120' and the active layer 110', and a second insulating layer 50' as an etch stop layer may be disposed on the active layer 110'. The source electrode 130S' and the drain electrode 130D' may penetrate through the second insulating layer 50', and thus may contact the active layer 110'. A third insulating layer 60' may be formed on the source electrode 130S' and the drain electrode 130D', and the pixel-defining layer 90 and the organic light-emitting device OLED may be disposed on the third insulating layer 60'.

The organic light-emitting device OLED includes a pixel electrode 510 connected to one of a source electrode (i.e., the source electrodes 130S and 130S') and a drain electrode (i.e., the drain electrodes 130D and 130D') of the thin-film transistor TFT, an intermediate layer 520 including an organic emission layer, and an opposite electrode 530.

The pixel electrode 510 has light-transmittance that allows light from the organic emission layer be emitted toward a bottom surface of the organic light-emitting display apparatus. The pixel electrode 510 may include at least one material selected from indium tin oxide (ITO), indium zinc oxide (IZO), zinc oxide (ZnO), indium oxide ($In_2O_3$), indium gallium oxide (IGO), and aluminum zinc oxide (AZO).

The organic emission layer may include a small-molecular organic material or a polymer organic material. If the organic emission layer includes the small-molecular organic material, the intermediate layer 520 may further include a hole transport layer (not shown), a hole injection layer (not shown), an electron transport layer (not shown), and an electron injection layer (not shown). In addition to these layers, the intermediate layer 520 may further include various layers. If the organic emission layer includes the polymer organic material, the intermediate layer 520 may further include the hole transport layer (not shown).

The opposite electrode 530 may be a reflective electrode including at least one material selected from Li, Ca, LiF/Ca, LiF/Al, Al, Ag, and Mg.

The storage capacitor Cst may include the first electrode 211, a second electrode 310, and a third electrode 410 disposed in parallel with respect to the first electrode 211. A portion the metal layer of the reflection control layer 20 may form the first electrode 211. In the exemplary embodiment of the present invention illustrated in FIG. 1, the second electrode 310 and the active layer 110 may be disposed on the same layer and formed from the same material, and the third electrode 410 and the gate electrode 120 may be disposed on the same layer and formed from the same material. In an exemplary embodiment of the present invention, the second electrode 310 and the active layer 110 may be disposed on the same layer and formed from the same material, and the third electrode 410 and the source and drain electrodes 130S and 130D may be disposed on the same layer and formed from the same material. In the exemplary embodiment of the present invention illustrated in FIG. 2, the second electrode 310' and the gate electrode 120' may be disposed on the same layer and formed from the same material, and the third electrode 410' and the source and drain electrodes 130S' and 130D' may be disposed on the same layer and formed from the same material.

Referring to FIG. 3, the third electrode 410 may be electrically connected to the first electrode 211 via a contact hole that penetrates through insulating layers (i.e., the buffer layer 30 and the first insulating layer 40) that are interposed between the third electrode 410 and the first electrode 211.

In the present exemplary embodiment, the storage capacitor Cst may use the first area 211, which is a portion of the metal layer of the reflection control layer 20, as the first electrode 211, and may use at least two layers among the active layer 110, the gate electrode 120, and the source and drain electrodes 130S and 130D of the thin-film transistor TFT as the second and third electrodes 310 and 410. Accordingly, the storage capacitor Cst may have a capacitance that corresponds to the sum of capacitances C1 and C2, without separately forming an electrode layer. The structure of the storage capacitor Cst according to the present exemplary embodiment may decrease the area and increase the capacity of the storage capacitor Cst, which may increase the aperture ratio of the organic light-emitting display apparatus.

In the exemplary embodiment illustrated in FIG. 3, the third electrode 410 is electrically connected to the first electrode 211 via the contact hole that penetrates through the insulating layers (i.e., the buffer layer 30 and the first insulating layer 40) that are interposed between the third electrode 410 and the first electrode 211. As illustrated in FIG. 2, when the third electrode 410' is disposed on the same layer as the source and drain electrodes 130S' and 130D' and formed from the same material as the source and drain electrodes 130S' and 130D', the third electrode 410' may be electrically connected to the first electrode 211 via a contact hole that penetrates through the buffer layer 30, the first insulating layer 40, and the second insulating layer 50'.

Figure 4A:
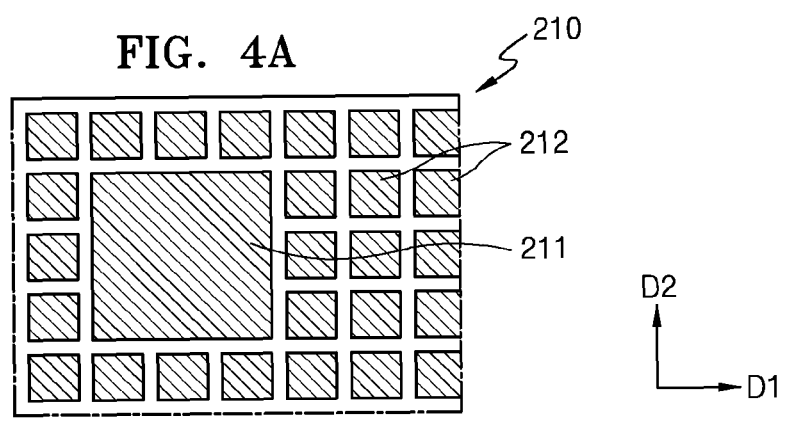
FIG. 4A is a plan view of a first metal layer that corresponds to portion A of FIG. 3, according to an exemplary embodiment of the present invention.
Figure 4B:
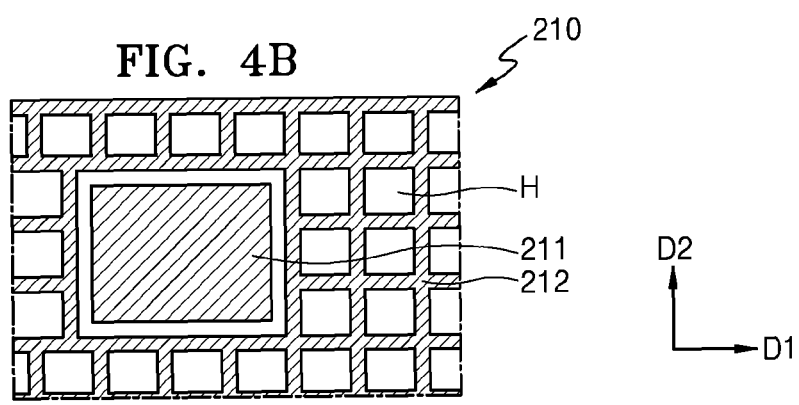
FIG. 4B is a plan view of the first metal layer that corresponds to portion A of FIG. 3, according to an exemplary embodiment of the present invention.

FIG. 4A is a plan view of the first metal layer 210 which corresponds to portion A of FIG. 3, according to an exemplary embodiment of the present invention. FIG. 4B is a plan view of the first metal layer 210 which corresponds to portion A of FIG. 3, according to an exemplary embodiment of the present invention.

Referring to FIG. 4A, the first metal layer 210 includes the first area 211 that has an island form and is separated from the second area, and corresponds to the first electrode 211 of the storage capacitor Cst. The second area 212 may surround the first area 211 while the second area 212 is separated from the first area 211.

The second area 212 may be patterned so that the second area 212 and the wiring 600 disposed on the reflection control layer 20 do not generate a parasitic capacitance. As illustrated in FIG. 4A, the second area 212 may be patterned to have a lattice structure, or as illustrated in FIG. 4B, the second area 212 may be patterned to have holes H.

As described above, according to an exemplary embodiments of the present invention, a portion of the metal layer included in the reflection control layer 20 of the bottom emission type organic light-emitting display apparatus may be formed as the first electrode 211 of the storage capacitor Cst, to increase the capacity of the storage capacitor Cst and improve aperture ratio without increasing the number of electrode layers. Accordingly, the bottom emission type organic light-emitting display apparatus may be suitable for a megapixel display apparatus.

In manufacturing the storage capacitor Cst, a process of patterning to form the first area 211 and the second area 212, and patterning of the second area 212 to prevent the wiring 600 and the metal layer of the reflection control layer 20 from generating a parasitic capacitance may be performed simultaneously, which may reduce manufacturing costs.

As described above, the organic light-emitting display apparatus according to the exemplary embodiments of the present invention may increase capacitance of the storage capacitor and improve aperture ratio.

Although certain exemplary embodiments and implementations have been described herein, other embodiments and modifications will be apparent from this description. Accordingly, the inventive concept is not limited to such exemplary embodiments, but rather to the broader scope of the presented claims and various obvious modifications and equivalent arrangements.

What is claimed is:

1. An organic light-emitting display apparatus, comprising:
    a substrate;
    a reflection control layer disposed on the substrate and comprising a first metal layer and a second metal layer and a dielectric layer interposed therebetween;
    a thin-film transistor (TFT) disposed on the reflection control layer and comprising an active layer, a gate electrode, a source electrode, and a drain electrode;
    a storage capacitor disposed on the reflection control layer and comprising a first electrode and a second electrode;
    a pixel electrode connected to one of the source electrode and the drain electrode;
    an intermediate layer disposed on the pixel electrode and comprising an organic emission layer; and
    an opposite electrode disposed on the intermediate layer,
    wherein the first metal layer of the reflection control layer comprises a first portion and a second portion insulated from each other,
    wherein the first portion comprises the first electrode of the storage capacitor, and
    wherein the first metal layer comprises a hole formed only in the second portion.

2. The organic light-emitting display apparatus of claim 1, wherein the second portion is separated from and surrounds the first portion.

3. The organic light-emitting display apparatus of claim 2, wherein the second portion comprises a lattice structure.

4. The organic light-emitting display apparatus of claim 1, wherein:
    the storage capacitor further comprises a third electrode disposed in parallel with respect to the first electrode; and
    the second electrode is disposed between the first electrode and the third electrode.

5. The organic light-emitting display apparatus of claim 4, wherein:
    the second electrode and the active layer are disposed on the same layer and comprise the same material; and
    the third electrode and at least one of the gate electrode, the source electrode, and the drain electrode are disposed on the same layer and comprise the same material.

6. The organic light-emitting display apparatus of claim 4, wherein:
    the second electrode and the gate electrode are disposed on the same layer and comprise the same material; and
    the third electrode, the source electrode, and the drain electrode are disposed on the same layer and comprise the same material.

7. The organic light-emitting display apparatus of claim 4, wherein the third electrode is electrically connected to the first electrode via a contact hole that penetrates through insulating layers disposed between the first electrode and the third electrode.

8. The organic light-emitting display apparatus of claim 1, wherein the intermediate layer is configured to generate light that passes through the reflection control layer and is emitted outside of the organic light-emitting display apparatus.

9. The organic light-emitting display apparatus of claim 1, further comprising a buffer layer disposed between the first electrode and the second electrode of the storage capacitor.

10. The organic light-emitting display apparatus of claim 1, wherein the substrate is a flexible substrate.

11. The organic light-emitting display apparatus of claim 4, wherein:
- the first, second, and third electrodes overlap and are in parallel with each other; and
- the capacitance of the storage capacitor corresponds to the sum of a first capacitance between the first and second electrodes and a second capacitance between the second and third electrodes.

12. An organic light-emitting display apparatus, comprising:
- a substrate;
- a reflection control layer disposed on the substrate and comprising a first metal layer, a second metal layer, and a dielectric layer disposed between the first and second metal layers;
- a thin-film transistor (TFT) disposed on the reflection control layer and comprising an active layer, a gate electrode, a source electrode, and a drain electrode;
- a storage capacitor disposed on the reflection control layer and comprising a first electrode and a second electrode;
- a pixel electrode connected to one of the source electrode and the drain electrode;
- an intermediate layer disposed on the pixel electrode and comprising an organic emission layer; and
- an opposite electrode disposed on the intermediate layer, wherein:
- the first electrode of the storage capacitor and the second metal layer of the reflection control layer comprise the same material;
- the first electrode and the second metal layer are electrically insulated and separated from each other, in plan view; and
- the dielectric layer has a first thickness configured to produce a phase difference of 180 degrees between a first light reflected by the first metal layer and a second light reflected by the second metal layer.

13. The organic light-emitting display apparatus of claim 1, wherein the dielectric layer has a thickness configured to produce a phase difference of 180 degrees between a first light reflected by the first metal layer and a second light reflected by the second metal layer.

* * * * *